United States Patent
Tomida et al.

(10) Patent No.: US 7,515,480 B2
(45) Date of Patent: Apr. 7, 2009

(54) NONVOLATILE SEMICONDUCTOR MEMORY DEVICE AND ITS WRITING METHOD

(75) Inventors: Masahiro Tomida, Nara (JP); Naoki Ueda, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 364 days.

(21) Appl. No.: 11/592,043

(22) Filed: Nov. 1, 2006

(65) Prior Publication Data
US 2007/0097724 A1    May 3, 2007

(30) Foreign Application Priority Data
Nov. 1, 2005    (JP) .............................. 2005-317996

(51) Int. Cl.
*G11C 11/34* (2006.01)
(52) U.S. Cl. .............................. 365/185.28; 365/185.25
(58) Field of Classification Search ............ 365/185.28, 365/185.25, 185.14
See application file for complete search history.

(56) References Cited

U.S. PATENT DOCUMENTS 6,794,712 B1 * 9/2004 Fujiwara ..................... 257/324
6,870,773 B2 * 3/2005 Noguchi et al. ......... 365/185.22
2001/0052615 A1 * 12/2001 Fujiwara ..................... 257/315
2008/0062801 A1 * 3/2008 Oonuki et al. .............. 365/226

FOREIGN PATENT DOCUMENTS

JP    11-066876 A    3/1999

* cited by examiner

*Primary Examiner*—Anh Phung
(74) *Attorney, Agent, or Firm*—Morrison & Foerster LLP

(57) ABSTRACT

A nonvolatile semiconductor memory device and its writing method for reducing a writing rate variation without changing a voltage condition applied for each memory cell in writing operation is provided. The device comprises a memory cell array configuration where each drain of the memory cells on the same column is connected to a first bit line via a second bit line and a bit line contact, and the shortest distance from each drain of the memory cells to the bit line contact varies according to a location of the memory cell in the column direction. The method includes a writing operation carried out sequentially from the nearest memory cell to the bit line contact, upon writing continuously so that the memory cell current becomes small for all or some of the memory cells on the same column between the two adjacent bit line contacts in the column direction.

12 Claims, 6 Drawing Sheets

NONVOLATILE SEMICONDUCTOR MEMORY DEVICE AND ITS WRITING METHOD

CROSS REFERENCE TO RELATED APPLICATION

This Nonprovisional application claims priority under 35 U.S.C. §119(a) on Patent Applications No. 2005-317996 filed in Japan on 1 Nov. 2005, the entire contents of which are hereby incorporated by reference.

BACKGROUND OF THE INVENTION

1. Field of the Invention

The present invention relates to a nonvolatile semiconductor memory device and a method for writing data in this device, and more particularly, the present invention relates to an improved technology of continuous writing operation for the nonvolatile semiconductor memory device with a virtual ground line type of a memory cell array structure.

2. Description of the Related Art

For example, the nonvolatile semiconductor memory device may include a memory cell having a diffusion bit line which is formed by an impure diffusion area and a virtual ground line type of a flush memory having a source and a drain formed by a diffusion bit line. More specifically, this nonvolatile semiconductor memory device is provided with a memory cell array, in which memory cells having a floating gate and a control gate arranged in a layer via an insulation film on a semiconductor substrate are aligned in a matrix in rows and columns. In this memory cell array, the sources or the drains of the memory cells arranged on the same column is connected by a diffusion bit line and control gates of respective memory cells are connected by a word line. Then, the diffusion bit line is connected to a bit line contact in units of predetermined continued word lines to be connected to a main bit line (a metal wire).

Writing operation and erasing operation of this nonvolatile semiconductor memory device are carried out by injecting or pulling out a charge in and from the floating gate of the memory cell. The case that the writing operation is carried out by channel hot electron injection in this nonvolatile semiconductor memory device will be described below.

The writing operation is made by applying a positive voltage to a selected word line and a selected bit line connected to the selected memory cell that is selected, respectively, for example, applying a voltage of +10V to the selected word line and a voltage of +5V to the selected bit line, respectively. As a result of this, a channel hot electron is generated and an electron is injected in the floating gate, and this increases a threshold voltage of the memory cell. In this case, the state that the threshold value of the memory cell is set to be higher than a predetermined value is defined as a writing state. In this case, writing current is supplied to the diffusion bit line, so that a voltage variation derived from a product of this writing current and a resistance value of the diffusion bit line is generated.

FIG. 5 shows the order of the writing operation of the memory cell carried out in a virtual ground line type of a conventional nonvolatile semiconductor memory device. Further, in the initial state, the all memory cells are made into an erasing state such that the threshold value is set to be lower than a predetermined value. When carrying out the writing operation, starting the writing operation sequentially from the memory cell connected to the word line at a left side of the drawing nearest to the bit line contact, the writing operation into the memory cell which is connected to the adjacent word line will be carried out toward a right side of the drawing. In other words, writing is done in the order of a row address, more specifically, in the order of row addresses WL0→WL1 ...→WLn. Finally, the threshold voltages of the all memory cells are set to be no less than a predetermined value.

However, in the virtual ground line type of the nonvolatile semiconductor memory device in which the shortest distance from each drain of the memory cells to the bit line contact varies in accordance with the arrangement place of the memory cell in the column direction, a drain voltage drop derived from a product of the resistance of the diffusion bit line formed in the impure diffusion area and the writing current is generated.

Then, in the case of carrying out the writing operation sequentially for a plurality of memory cells on the same column while moving the selected memory cell into a certain direction, as shown in FIG. 6, in the memory cells near the bit line contact after writing is started, there are many bit line leak currents since many memory cells in the erasing state are connected to the bit line, however, the resistance value of the diffusion bit line is small and the drain voltage is lowered little because the resistance value of the diffusion bit line is small. On the other hand, in the memory cell farthest from the bit line contact, namely, in the memory cell located in the middle of two bit line contacts, the distance from the bit line contact is long, so that the resistance value of the diffusion bit line is made the largest. Further, since nearly half of the memory cells in the erasing state (the state that the threshold voltage is low) remain in the word line address that is not written, there is a bit line leak current to be generated when the threshold value of the memory cell in the erasing state is low and lowering of the drain voltage becomes the highest. Basically, the farther the memory cell is separated from the bit line contact, the lower the drain voltage becomes and the slower a writing rate becomes. In other words, there is a difference between the cells near the bit line contact and the cells far from the bit line contact, and then, the writing rates are varied in a direction of the word line.

In recent years, due to a large volume of the nonvolatile semiconductor memory device, it is general that multilevel writing is carried out; however, if the writing rates are largely varied, a divided margin between respective states upon multilevel writing is decreased, and this gives an impact on the reading operation and reliability in maintain of an electric charge.

As such a multilevel writing technology to decrease variation of the writing rates of the memory cell, there is a technology to change a voltage applied to each memory cell in accordance with the arrangement place of the memory cell upon writing (for example, refer to Japanese Application Laid-Open No. 11-066876). In this technology, by setting a higher applied voltage (a word line voltage) upon writing for the memory cell having a late writing rate as compared to the memory cell having a fast writing rate, variation of the writing rates of respective cells are decreased.

SUMMARY OF THE INVENTION

The present invention has been made taking the foregoing problems into consideration and an object of which is to provide a writing method of a nonvolatile semiconductor memory device capable of reducing a writing rate variation without change of a voltage condition applied for each memory cell in writing operation. In addition, other object of the present invention is to provide a nonvolatile semiconductor memory device capable of reducing a writing rate variation.

In order to attain the above-described object, according to a first aspect of the present invention, in a writing method of a nonvolatile semiconductor memory device, the nonvolatile semiconductor memory device comprises a memory cell array including nonvolatile semiconductor memory cells arranged in a matrix in a row and column directions having a memory function unit capable of accumulating an electric charge and a MOSFET structure capable of controlling a memory cell current flowing through between a drain and a source depending on the sizes of the electric charges accumulated in the memory function unit. The memory cell array is configured so that each drain of the memory cells arranged on the same column is connected to a common first bit line made of a metal wire via a second bit line having a higher resistance than that of the metal wire and a bit line contact to connect the first bit line to the second bit line electrically and the shortest distance from each drain of the memory cells to the bit line contact varies in accordance with a location of the memory cell in the column direction. In the writing method, in the case of continuously carrying out the writing operation to control the accumulated electric charge amount of the memory function unit so that the memory cell current is made small for all or some of the memory cells on the same column arranged between the two adjacent bit line contacts in the column direction, the writing operation is carried out sequentially from the memory cell arranged at the nearest position to the bit line contact.

In order to attain the above-described object, according to a second aspect of the present invention, in a writing method of a nonvolatile semiconductor memory device, the nonvolatile semiconductor memory device comprises a memory cell array including nonvolatile semiconductor memory cells arranged in a matrix in a row direction and a column direction having a memory function unit capable of accumulating an electric charge and a MOSFET structure capable of controlling a memory cell current flowing through between a drain and a source depending on the sizes of the electric charges accumulated in the memory function unit. The memory cell array is configured so that each drain of the memory cells arranged on the same column is connected to a common first bit line made of a metal wire via a second bit line having a higher resistance than that of the metal wire and a bit line contact to connect the first bit line to the second bit line electrically and the shortest distance from each drain of the memory cells to the bit line contact varies in accordance with a location of the memory cell in the column direction. In the writing method, in the case of continuously carrying out the writing operation to control the accumulated electric charge amount of the memory function unit so that the memory cell current is made large for all or some of the memory cells on the same column arranged between the two adjacent bit line contacts in the column direction, the writing operation is carried out sequentially from the memory cell arranged at the farthest position from the bit line contact.

According to a third aspect of the present invention, in the writing method of a nonvolatile semiconductor memory device in any of the above-described aspects of the present invention, the nonvolatile semiconductor memory device further comprises a memory cell configuration, in which each source of the memory cells arranged on the same column is connected to a common first source line made of a metal wire via a second source line having a higher resistance than that of the metal wire and a source line contact to connect the first source line to the second source line electrically, wherein between the two adjacent memory cells in the row direction, each second bit line of the two adjacent memory cells, each second source line of the two adjacent memory cells, or the second bit line of one of the two adjacent memory cells and the second source line of the other memory cell are electrically connected with each other sharing a common diffusion wire which is formed by impurity diffusion.

Further, according to a fourth aspect of the present invention, in the writing method of a nonvolatile semiconductor memory device in any of the above-described aspects of the present invention, the nonvolatile semiconductor memory device is configured so that a row address range of a writing address space to define the plural memory cells as a writing target in the continuous writing operation includes a row address range of the memory cells on the same column arranged between the two adjacent bit line contacts of the same bit line.

According to a fifth aspect of the present invention, in the writing method of a nonvolatile semiconductor memory device in the third aspect of the present invention, a row address range of a writing address space to define the plural memory cells as a writing target in the continuous writing operation includes a row address range of the memory cells on the same column arranged between the two adjacent bit line contacts of the same bit line and a column address range of the writing address space includes a column address range of the plural memory cells continuously connected in the row direction by electrically connecting each second bit line of the two adjacent memory cells, each second source line of the two adjacent memory cells, or the second bit line of one of the two adjacent memory cells and the second source line of the other memory cell with each other by the common diffusion wire between the two adjacent memory cells in the row direction.

In order to attain the above-described object, the nonvolatile semiconductor memory device according to the present invention comprises a memory cell array including nonvolatile semiconductor memory cells arranged in a matrix in a row and column directions having a memory function unit capable of accumulating an electric charge and a MOSFET structure capable of controlling a memory cell current flowing through between a drain and a source depending on the sizes of the electric charges accumulated in the memory function unit, and a memory cell array configuration in which each drain of the memory cells arranged on the same column is connected to a common first bit line made of a metal wire via a second bit line having a higher resistance than that of the metal wire and a bit line contact to connect the first bit line to the second bit line electrically and the shortest distance from each drain of the memory cells to the bit line contact varies in accordance with a location of the memory cell in the column direction, and further comprises a writing control circuit for controlling the order of the writing operation for all or some of the memory cells on the same column arranged between the two adjacent bit line contacts in the column direction on the basis of the writing method of the nonvolatile semiconductor memory device according to the first aspect or the second aspect.

The nonvolatile semiconductor memory device according to the above-described aspects further comprises a memory cell configuration in which each source of the memory cells arranged on the same column is connected to a common first source line made of a metal wire via a second source line having a higher resistance than that of the metal wire and a source line contact to connect the first source line to the second source line electrically, wherein between the two adjacent memory cells in the row direction, each second bit line of the two adjacent memory cells, each second source line of the two adjacent memory cells, or the second bit line of one of the two adjacent memory cells and the second source line of the other memory cell are electrically connected with each other sharing a common diffusion wire which is formed by impurity diffusion.

According to the present invention, in the case of continuously carrying out a writing operation to control the accumulated electric charge of the memory function unit so that the memory cell current is made small for all or some of the memory cells on the same column arranged between two adjacent bit line contacts in the column direction, when the writing operation is carried out sequentially from the memory cell located nearest to the bit line contact, by writing the memory cell arranged at the nearest position to the bit line contact in first, a drain voltage drop caused by a resistance value of a diffusion bit line is reduced due to a bit line leak current inhibiting effect caused by rise of a threshold voltage of the memory cell of which writing is terminated and this makes it possible to prevent lowering of a drain voltage of the memory cell to be written also in the memory cell which is the farthest from the bit line contact. As a result, it is possible to reduce variation of the writing rates and secure a reading margin and a nonvolatile semiconductor memory device having a high reliability can be realized.

In addition, according to the present invention, in the case of continuously carrying out a writing operation to control the accumulated electric charge amount of the memory function unit so that the memory cell current is made large, even if the nonvolatile semiconductor memory device is configured so that the writing operation is carried out sequentially from the memory cell arranged at the farthest position from the bit line contact, it is possible to inhibit the drain voltage drop caused by the resistance value of the diffusion bit line due to the bit line leak current inhibiting effect caused by rise of the threshold value of the memory cell of which writing is terminated.

DETAILED DESCRIPTION OF THE INVENTION

Embodiments of the present invention of a nonvolatile semiconductor memory device and its writing method according to the present invention (hereinafter, abbreviated as "the present device" and "the present method") will be described below with reference to the drawings.

First Embodiment

A first embodiment of the present device will be described with reference to FIGS. 1 to 4. According to the present embodiment, a nonvolatile semiconductor memory device provided with a flash memory cell having a MOSFET structure is assumed, and by raising a threshold voltage by means of a hot electron injection into a floating gate, the writing operation of the memory cell will be carried out.

Figure 1:
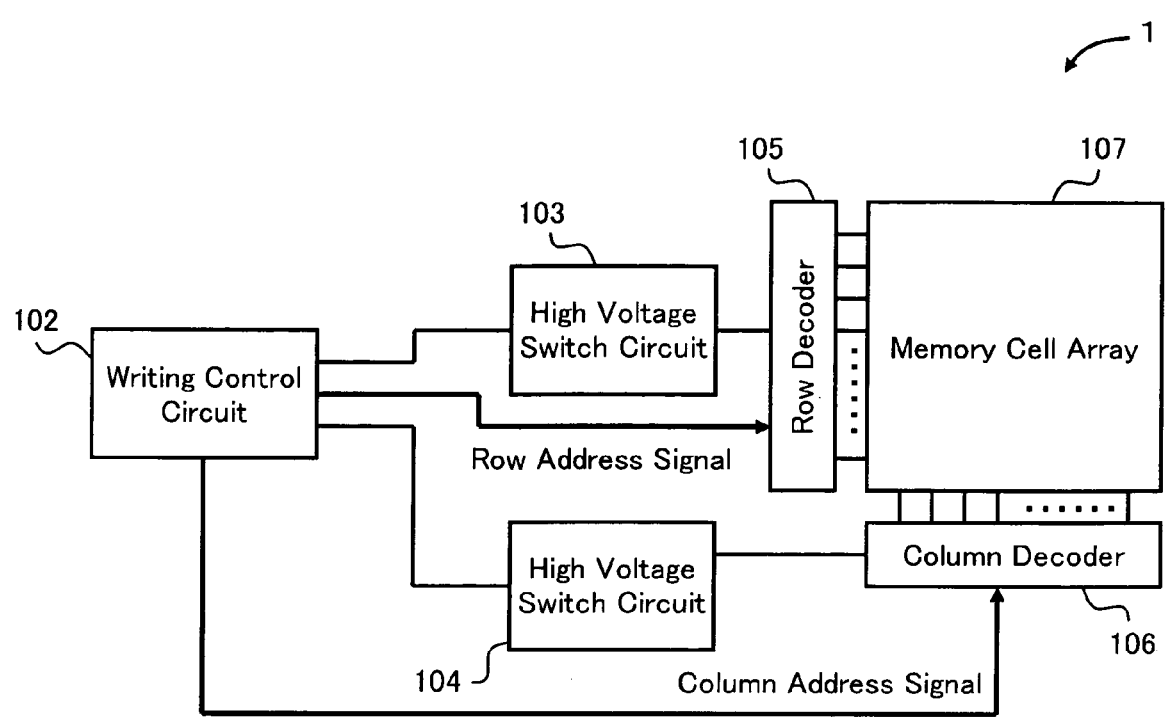
FIG. 1 is a schematic block diagram showing a schematic structure of a nonvolatile semiconductor memory device according to the present invention.
Figure 2:
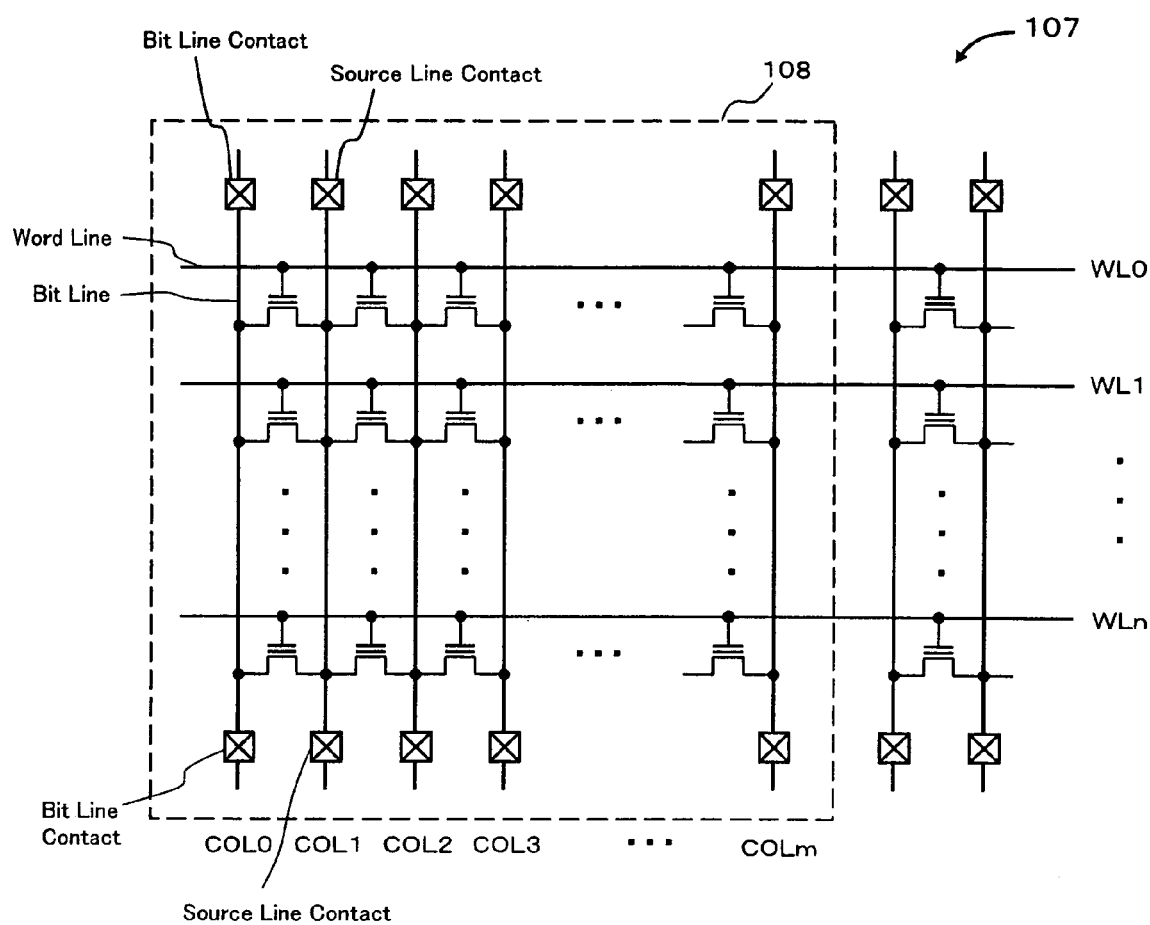
FIG. 2 is a schematic block diagram showing a schematic structure of a memory cell array of a nonvolatile semiconductor memory device according to the present invention.

As shown in FIG. 1, in a memory cell array 107, nonvolatile semiconductor memory cells having the MOSFET structure capable of controlling a memory cell current flowing through between a drain and a source depending on the sizes of the electric charges accumulated in the floating gate are aligned in a matrix in a row direction and a column direction. As shown in FIG. 2, in the memory cells on the same row, each control gate is connected to a common word line, respectively, and in the memory cells on the same column, each drain electrode is connected to a common bit line, respectively (a diffusion bit line, a second bit line) and each source electrode is connected to a common source line (a diffusion source line, a second source line), respectively.

Further, as shown in FIG. 2, a bit line contact is formed for each of the predetermined number of memory cells continued in the column direction on the diffusion bit line. This bit line contact is connected to a common first bit line (not illustrated) made of a metal wire having a lower resistance than that of the diffusion bit line. In addition, on the diffusion source line, a source line contact is formed on the diffusion source line for each of the predetermined number of memory cells continued in the column direction. This source line contact is connected to a common first source line (not illustrated) made of a metal wire having a lower resistance than that of the diffusion source line.

Still further, between two adjacent memory cells in the row direction, the diffusion bit lines of the two adjacent memory cells and the diffusion source lines of the two adjacent memory cells are electrically connected sharing a common diffusion wire which is formed by impurity diffusion, respectively. Due to such a structure, the memory array 107 is configured by a virtual ground line type of a memory cell array structure in which the shortest distance from each drain of the memory cells to the bit line contact varies in accordance with a location of the memory cell in a column direction. Further, a relation between the bit line and the source line at the virtual ground line type of the memory cell array serves to conveniently distinguish the fact that the former is connected to the side of the drain of the memory cell from the fact that the latter is connected to the side of the source of the memory cell. When the relation between the source and the drain of the memory cell is fixed and not changed with respect to the column address, one diffusion wire shared by two adjacent memory cells in the row direction becomes a diffusion bit line with respect to one memory cell and it becomes a diffusion source line with respect to the other.

Here, assuming that As injection is carried out in a range of $3 \times 10^{14}$ to $1 \times 10^{15}$ cm$^{-2}$ in the impure substance diffusion area of which a bit line is made, the width of the diffusion bit line is defined as 0.15 μm, and the bit line contacts are arranged for each of 32 word lines, a resistance value of a diffusion bit line of the memory cell located farthest from the bit line contact becomes about 5 kΩ. Since the writing current upon the writing operation by the hot electron is in the range of 200 to 300 μA, if there is no bit line leak current, a drain voltage of a memory cell farthest from the bit line contact is lowered by about 1 to 1.5V. Further, compared to a drain voltage condition (normally, 5V to 6V) given from the outside of the memory cell upon writing, it is known that voltage drop of not less than 1V has a large impact on the writing rate. As a result, when there is a bit line leak current, further, drop of the drain voltage becomes remarkable and this has a large impact on the writing rate.

In addition, a row decoder 105 for selecting the memory cell in the memory cell array 107 in units of rows is arranged at the end in the row direction of the memory cell array 107 to be connected to each word line. In addition, a column decoder 106 for selecting the memory cell in the memory cell array 107 in units of columns is arranged at the end in the column direction of the memory cell array 107 to be connected to each bit line. To the row decoder 105 and the column 106, high voltage switch circuits 103 and 104 are connected, respectively, which selectively supply a high voltage to be applied to the word line and the bit line selected during the writing operation. High voltage supply operations of the high voltage switch circuits 103 and 104 are controlled by a writing control signal outputted from a writing control circuit 102 for controlling a sequence of processing procedure required for the writing operation. The writing control circuit 102 controls the order of the writing operation for the memory cells on the same row, which is arranged between two adjacent bit line contacts in the column direction.

Subsequently, the present method will be described with reference to FIG. 3 and FIG. 4. According to the present method, selecting a column address and a row address by a column decoder and a row decoder, writing will be done on the basis of a control signal from a writing control circuit 7. According to the present embodiment, it is assumed that the writing operation is continuously carried out for the all memory cells on the same columns arranged between two adjacent bit line contacts in a column direction and the writing operation will be done sequentially from the memory cell arranged nearest to the bit line contact.

Figure 3:
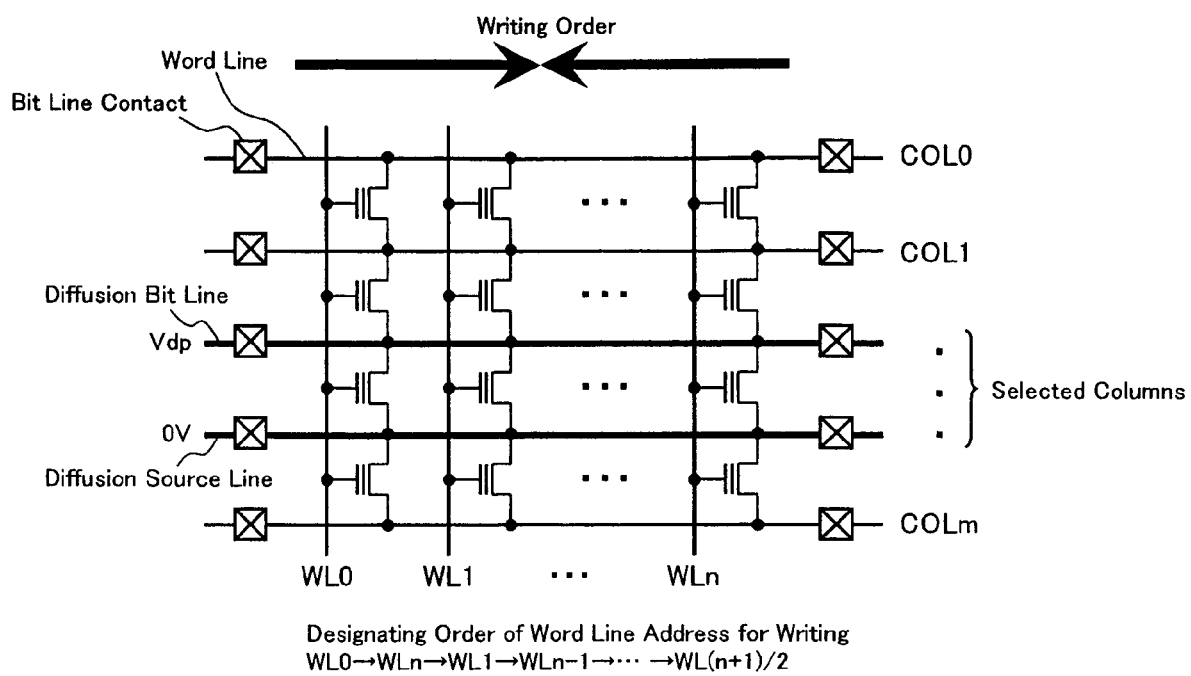
FIG. 3 is an explanatory view showing a writing method of a nonvolatile semiconductor memory device according to the present invention.
Figure 4:
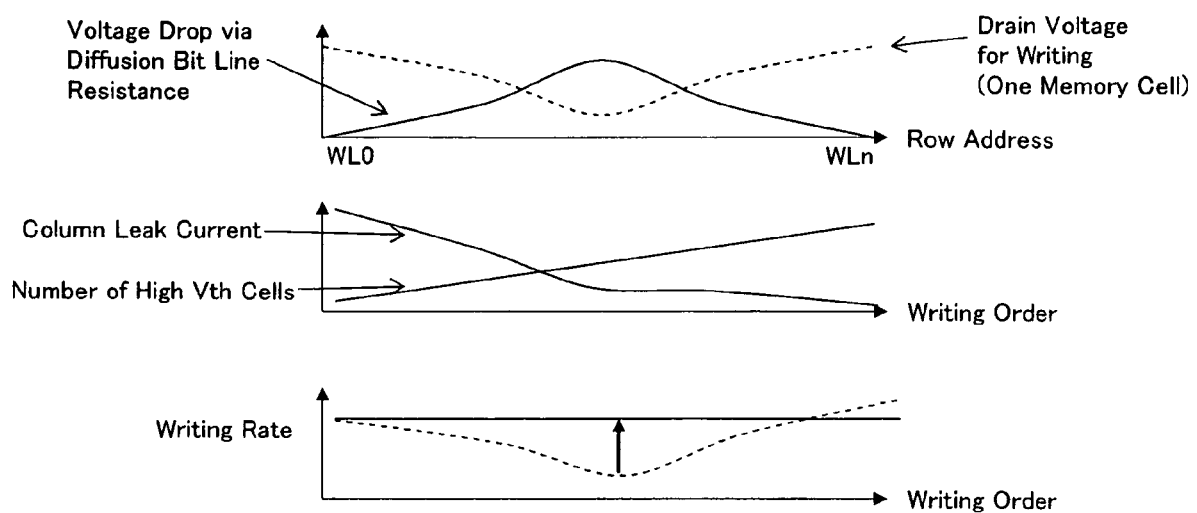
FIG. 4 is a graph showing a distribution of a drain voltage with respect to a resistance value of a diffusion bit line in a single memory cell, a bit line leak current and the number of cells with respect to the order of writing, and a shift of a writing rate according to the writing method of a nonvolatile semiconductor memory device of the present invention.
Figure 5:
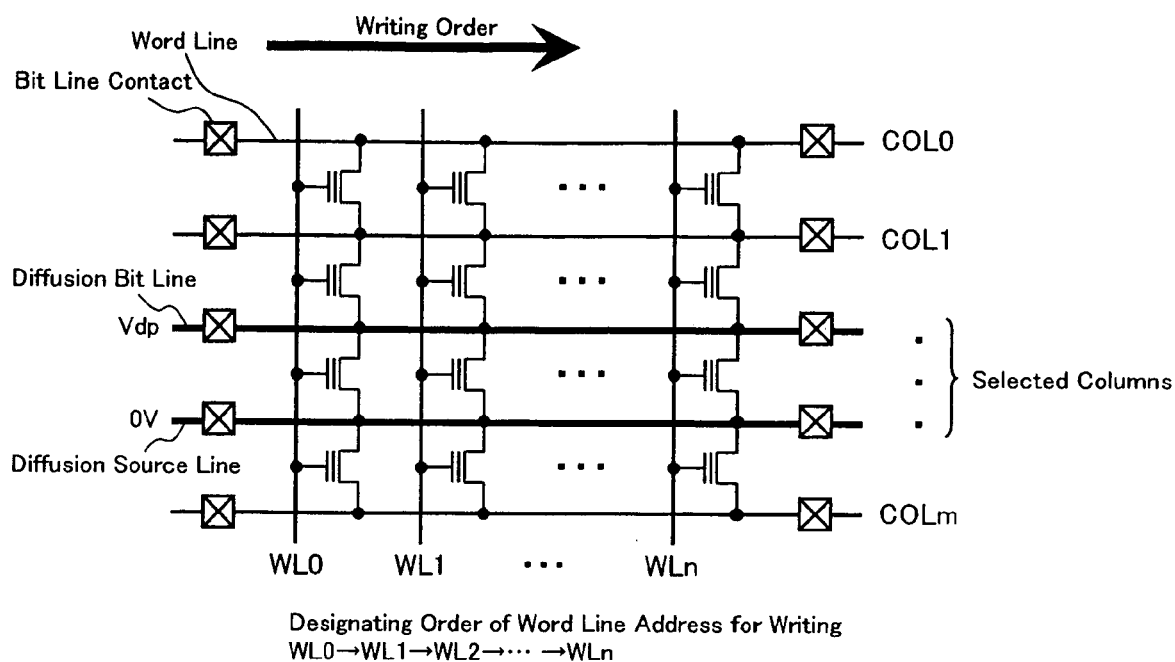
FIG. 5 is an explanatory view showing a writing method of a nonvolatile semiconductor memory device according to a conventional art.
Figure 6:
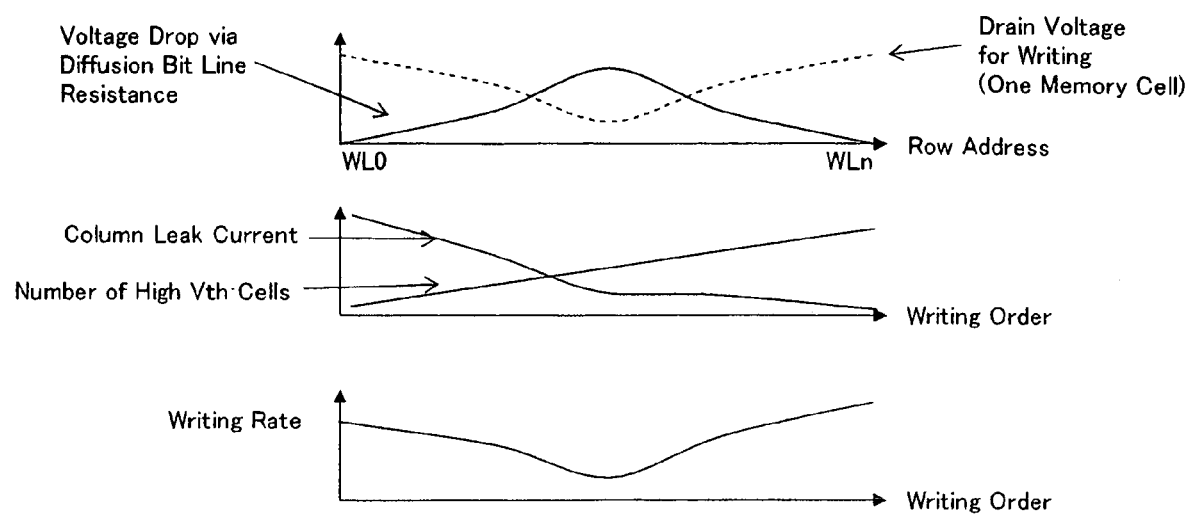
FIG. 6 is a graph showing a distribution of a drain voltage with respect to a resistance value of a diffusion bit line in a single memory cell, a bit line leak current and the number of cells with respect to the order of writing, and a shift of a writing rate according to the writing method of a nonvolatile semiconductor memory device of the conventional art.

More specifically, as shown in FIG. 3, in the present method according to the present embodiment, the column address of the writing object may be designated and a voltage Vdp may be applied to the diffusion bit line of the selected column of the writing object. Next, assuming that the number of memory cells between the bit line contacts is n+1, a voltage Vg is applied for writing to the word line of each row address in the order of row addresses WL0→WLn→WLn1→WLn−1→ . . . →WL(n+1)/2 to terminate writing at the memory cell which is located at the farthest position from each bit line contact. Carrying out the writing operation in this way, as shown in FIG. 4, since the memory cell arranged farther from the bit line contact is written later, a bit line leak current upon writing is inhibited. Therefore, a writing rate is not lowered due to the bit line leak current, and thus to be capable of preventing variation of the writing rate of each memory cell arranged in the column direction.

Second Embodiment

Next, the present method in the case where there are plural columns of memory cells of the writing object will be described. According to the present embodiment, assuming the case that the plural memory cells in a sector 108 shown in FIG. 2 are written continuously, the present method will be explained. Here, a range of a row address of the sector 108 is defined in the range of WL0 to WLn sandwiched by two bit contacts and a range of a column address is defined in the range of COL0 to COLm.

According to the present embodiment, as same as the first embodiment, at first, in the sector 108 shown in FIG. 2, the writing operation is carried out sequentially from the memory cell arranged nearest to the bit line contact for the all memory cells of the same column arranged between two adjacent bit line contacts in the column direction of the column address COL0, and this writing operation is repeatedly carried out for the other column addresses (COL1→COL2→ . . . →COLm) sequentially. Due to such a configuration, as same as the first embodiment, also in the sector 108, it is possible to inhibit variation of the writing rate of each memory cell arranged in the column direction.

Further, as a modified example, at first, the writing operation is carried out sequentially in the column address order for a predetermined row address, and the writing operation is repeatedly carried out in the column address order for the other row addresses. More specifically, at first, the row address WL0 is designated and a voltage Vg is applied to a word line, the writing operation is carried out in the column address order (COL0→COL1 . . . →COLm). Then, the row address WLn is designated, the writing operation is carried out in the column address order (COL0→COL1 . . . →COLm). As same as this, the writing operation is carried out also for the other row addresses and terminated at the cell farthest from the bit line contact. As a result, the designation order of the row address in one column address is the same as the first embodiment, and variation of the writing rate of each memory cell arranged in the column direction can be inhibited.

Also in the case of carry out the writing operation for a plurality of sectors, the writing operation may be carried out for each sector according to any one the above-described methods.

Next, other embodiments of the present device and the present method will be described.

(1) According to each of the above-described embodiments, the explanation is made assuming the case that the writing operation is continuously carried out in a flash memory to control an accumulated electric charge of a memory function unit so that a memory cell current is made small. However, in the case of carrying out the writing operation continuously to control the accumulated electric charge of the memory function unit so that the memory cell current is made large, the writing operation may be carried out sequentially from the memory cell arranged at the farthest position from the bit line contact. Thereby, also according to the present embodiment, as same as each of the above-described embodiments, it is possible to inhibit variation of writing rate of each memory cell arranged in the column direction.

(2) According to each of the above-described embodiments, as a nonvolatile semiconductor memory device, the flash memory is described, however, each of the above-described embodiments is not limited to this. In addition, although explanation is made taking the virtual ground line type of the memory cell array as an example of a memory cell array, each of the above-described embodiments is not limited to this and can be applied to any of the memory cell arrays in which the bit line leak current is different according to the arrangement place of the memory cell.

(3) According to each of the above-described embodiments, the case that the second bit line and the second source line are wired in the diffusion wire is explained. However, for example, even if the second bit line and the second source line are made into row resistance by making them from silicide or the like, in the case that they have higher resistance than those of the first bit line and the first source line made of a metal wire, when a distance between the bit line contacts is long and the bit line leak current is large, as same as each of the above-described embodiments, a problem such that the writing rate is inevitable. If the present device and the present method are applied to such a case, it is possible to inhibit variation of the writing rate.

(4) According to each of the above-described embodiments, the case that the writing control circuit 102 controls the order of the writing operation for the all memory cells of the same column arranged between two adjacent bit line contacts in the column direction is described, however, it is preferable that the order of the writing operation for some of the memory cells of the same column arranged between two adjacent bit line contacts in the column direction is controlled by the present method. In this case, it is also possible to inhibit variation of the writing rate of each memory cell arranged in the column direction in the same way.

Although the present invention has been described in terms of the preferred embodiments, it will be appreciated that various modifications and alterations might be made by those skilled in the art without departing from the invention. The invention should therefore be measured in terms of the claims which follow.

What is claimed is:

1. A writing method of a nonvolatile semiconductor memory device, which comprises
    a memory cell array including nonvolatile semiconductor memory cells arranged in a matrix in a row and column directions having a memory function unit capable of accumulating an electric charge and a MOSFET structure capable of controlling a memory cell current flowing through between a drain and a source depending on sizes of the electric charges accumulated in the memory function unit and
    a memory cell array configuration in which each drain of the memory cells arranged on the same column is connected to a common first bit line made of a metal wire via a second bit line having a higher resistance than that of the metal wire and a bit line contact to connect the first bit line to the second bit line electrically, and the shortest distance from each drain of the memory cells to the bit line contact varies in accordance with a location of the memory cell in the column direction,
    the writing method including a writing operation which is carried out sequentially from the memory cell arranged at the nearest position to the bit line contact, in the case of continuously carrying out the writing operation to control the accumulated electric charge amount of the memory function unit so that the memory cell current is made small for all or some of the memory cells on the same column arranged between the two adjacent bit line contacts in the column direction.

2. The writing method according to claim 1, wherein
    the nonvolatile semiconductor memory device further comprises a memory cell array configuration in which each source of the memory cells arranged on the same column is connected to a common first source line made of a metal wire via a second source line having a higher resistance than that of the metal wire and a source line contact to connect the first source line to the second source line electrically and
    between the two adjacent memory cells in the row direction, each second bit line of the two adjacent memory cells, each second source line of the two adjacent memory cells, or the second bit line of one of the two adjacent memory cells and the second source line of the other memory cell are electrically connected with each other sharing a common diffusion wire which is formed by impurity diffusion.

3. The writing method according to claim 2, wherein
    a row address range of a writing address space to define a plurality of the memory cells as a writing target in the continuous writing operation includes a row address range of the memory cells on the same column arranged between the two adjacent bit line contacts of the same bit line, and
    a column address range of the writing address space includes a column address range of a plurality of the memory cells continuously connected in the row direction by electrically connecting each second bit line of the two adjacent memory cells, each second source line of the two adjacent memory cells, or the second bit line of the two adjacent memory cells and the second source line of the other memory cell with each other by the common diffusion wire between the two adjacent memory cells in the row direction.

4. The writing method according to claim 1, wherein
    a row address range of a writing address space to define a plurality of the memory cells as a writing target in the continuous writing operation includes a row address range of the memory cells on the same column arranged between the two adjacent bit line contacts of the same bit line.

5. A nonvolatile semiconductor memory device comprises:
    a memory cell array including nonvolatile semiconductor memory cells arranged in a matrix in a row and column directions having a memory function unit capable of accumulating an electric charge and a MOSFET structure capable of controlling a memory cell current flowing through between a drain and a source depending on sizes of the electric charges accumulated in the memory function unit;
    a memory cell array configuration in which each drain of the memory cells arranged on the same column is connected to a common first bit line made of a metal wire via a second bit line having a higher resistance than that of the metal wire and a bit line contact to connect the first bit line to the second bit line electrically, and the shortest distance from each drain of the memory cells to the bit line contact varies in accordance with a location of the memory cell in the column direction; and
    a writing control circuit for controlling an order of the writing operation for all or some of the memory cells on the same column arranged between the two adjacent bit line contacts in the column direction on the basis of the writing method according to claim 1.

6. The nonvolatile semiconductor memory device according to claim 5 further comprising a memory cell array configuration in which each source of the memory cells arranged on the same column is connected to a common first source line made of a metal wire via a second source line having a higher resistance than that of the metal wire and a source line contact to connect the first source line to the second source line electrically, wherein
    between the two adjacent memory cells in the row direction, each second bit line of the two adjacent memory cells, each second source line of the two adjacent memory cells, or the second bit line of one of the two adjacent memory cells and the second source line of the other memory cell are electrically connected with each other sharing a common diffusion wire which is formed by impurity diffusion.

7. A writing method of a nonvolatile semiconductor memory device, which comprises
a memory cell array including nonvolatile semiconductor memory cells arranged in a matrix in a row and column directions having a memory function unit capable of accumulating an electric charge and a MOSFET structure capable of controlling a memory cell current flowing through between a drain and a source depending on sizes of the electric charges accumulated in the memory function unit and
a memory cell array configuration in which each drain of the memory cells arranged on the same column is connected to a common first bit line made of a metal wire via a second bit line having a higher resistance than that of the metal wire and a bit line contact to connect the first bit line to the second bit line electrically, and the shortest distance from each drain of the memory cells to the bit line contact varies in accordance with a location of the memory cell in the column direction,
the writing method including a writing operation which is carried out sequentially from the memory cell arranged at the farthest position from the bit line contact, in the case of continuously carrying out the writing operation to control the accumulated electric charge amount of the memory function unit so that the memory cell current is made large for all or some of the memory cells on the same column arranged between the two adjacent bit line contacts in the column direction.

8. The writing method according to claim 7, wherein
the nonvolatile semiconductor memory device further comprises a memory cell array configuration in which each source of the memory cells arranged on the same column is connected to a common first source line made of a metal wire via a second source line having a higher resistance than that of the metal wire and a source line contact to connect the first source line to the second source line electrically and
between the two adjacent memory cells in the row direction, each second bit line of the two adjacent memory cells, each second source line of the two adjacent memory cells, or the second bit line of one of the two adjacent memory cells and the second source line of the other memory cell are electrically connected with each other sharing a common diffusion wire which is formed by impurity diffusion.

9. The writing method according to claim 8, wherein
a row address range of a writing address space to define a plurality of the memory cells as a writing target in the continuous writing operation includes a row address range of the memory cells on the same column arranged between the two adjacent bit line contacts of the same bit line, and
a column address range of the writing address space includes a column address range of a plurality of the memory cells continuously connected in the row direction by electrically connecting each second bit line of the two adjacent memory cells, each second source line of the two adjacent memory cells, or the second bit line of one of the two adjacent memory cells and the second source line of the other memory cell with each other by the common diffusion wire between the two adjacent memory cells in the row direction.

10. The writing method according to claim 7, wherein
a row address range of a writing address space to define a plurality of the memory cells as a writing target in the continuous writing operation includes a row address range of the memory cells on the same column arranged between the two adjacent bit line contacts of the same bit line.

11. A nonvolatile semiconductor memory device comprising:
a memory cell array including nonvolatile semiconductor memory cells arranged in a matrix in a row and column directions having a memory function unit capable of accumulating an electric charge and a MOSFET structure capable of controlling a memory cell current flowing through between a drain and a source depending on sizes of the electric charges accumulated in the memory function unit;
a memory cell array configuration in which each drain of the memory cells arranged on the same column is connected to a common first bit line made of a metal wire via a second bit line having a higher resistance than that of the metal wire and a bit line contact to connect the first bit line to the second bit line electrically, and the shortest distance from each drain of the memory cells to the bit line contact varies in accordance with a location of the memory cell in the column direction; and
a writing control circuit for controlling an order of the writing operation for all or some of the memory cells on the same column arranged between the two adjacent bit line contacts in the column direction on the basis of the writing method according to claim 7.

12. The nonvolatile semiconductor memory device according to claim 11 further comprising a memory cell array configuration in which each source of the memory cells arranged on the same column is connected to a common first source line made of a metal wire via a second source line having a higher resistance than that of the metal wire and a source line contact to connect the first source line to the second source line electrically, wherein
between the two adjacent memory cells in the row direction, each second bit line of the two adjacent memory cells, each second source line of the two adjacent memory cells, or the second bit line of one of the two adjacent memory cells and the second source line of the other memory cell are electrically connected with each other sharing a common diffusion wire which is formed by impurity diffusion.

* * * * *